United States Patent [19]

Kobayashi

[11] Patent Number: 4,953,134
[45] Date of Patent: Aug. 28, 1990

[54] SEMICONDUCTOR MEMORY DEVICE WITH IMPROVED ADDRESS WIRING ARRANGEMENT

[75] Inventor: Yasuo Kobayashi, Tokyo, Japan
[73] Assignee: NEC Corporation, Tokyo, Japan
[21] Appl. No.: 316,907
[22] Filed: Feb. 28, 1989
[30] Foreign Application Priority Data
  Feb. 29, 1988 [JP] Japan ............... 62-48317
[51] Int. Cl.[5] .............................. G11C 13/00
[52] U.S. Cl. ............... 365/230.03; 365/230.06
[58] Field of Search ............ 365/51, 63, 230.06, 365/230.03, 190

[56] References Cited
U.S. PATENT DOCUMENTS
4,727,516 2/1988 Yoshida et al. .................. 365/200

Primary Examiner—Terrell W. Fears
Attorney, Agent, or Firm—Sughrue, Mion, Zinn, Macpeak & Seas

[57] ABSTRACT

A semiconductor memory device having improved address wiring and address decoding structures is disclosed. The memory device comprises a plurality of address decoders arranged separately, an address buffer for generating "n"-bits of address signals, a set of address wirings coupled to said address buffer and the address decoders, the number of address wirings being "n", and a plurality of inverting circuits provided for the address decoders, each of inverting circuits coupled to the address wirings and being responsive to the signals at the address wirings for generating their complementary signals to be applied to the associated address decoder.

6 Claims, 5 Drawing Sheets

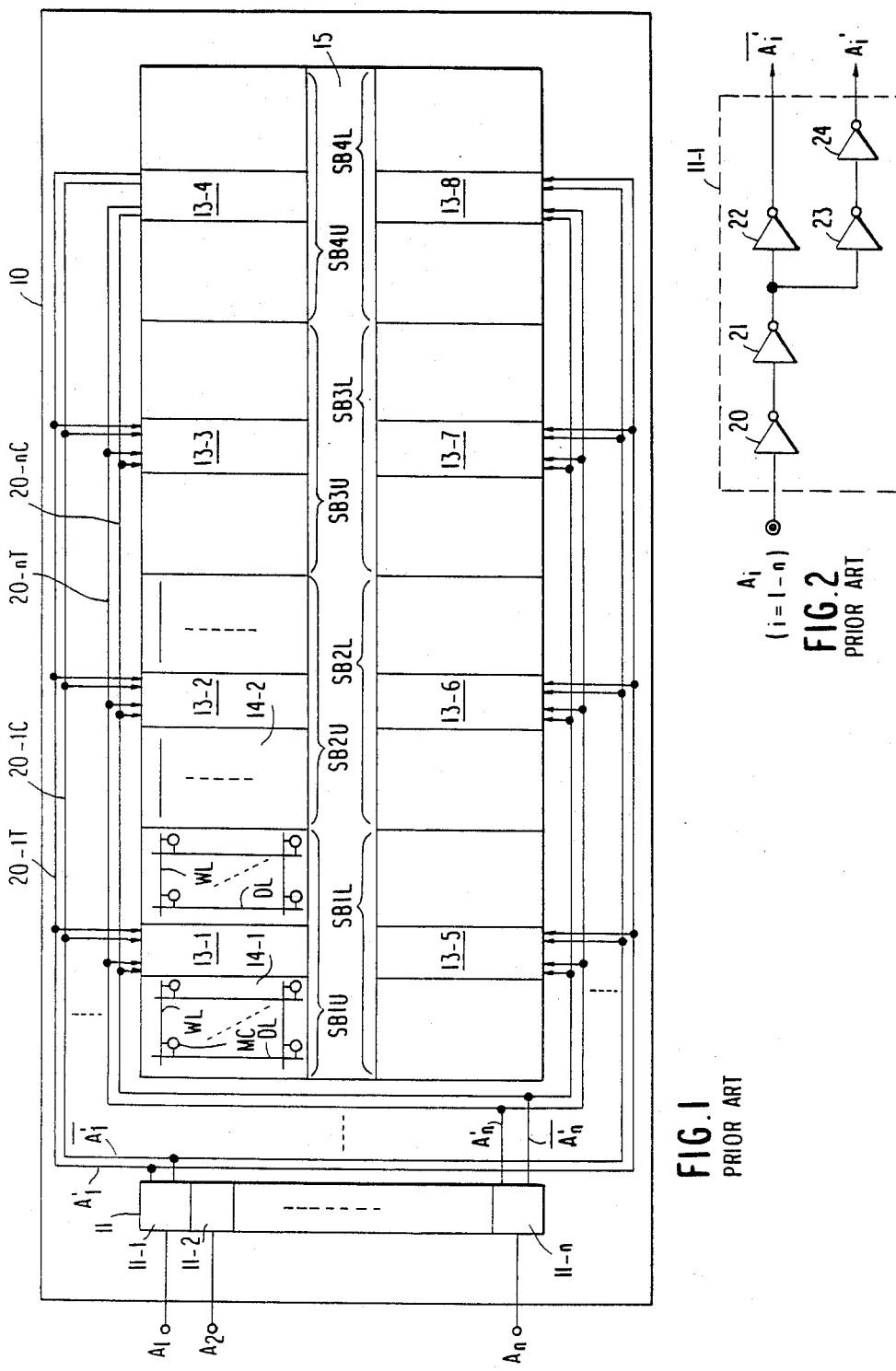
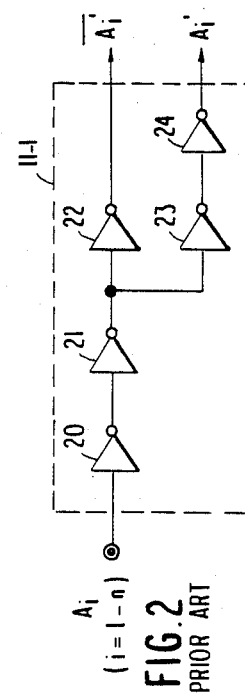
FIG. 1 PRIOR ART
FIG. 2 PRIOR ART

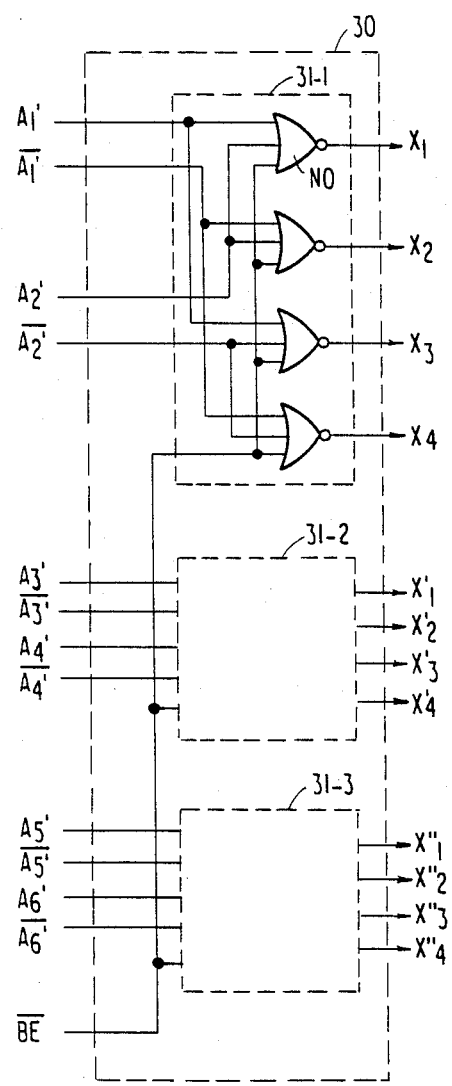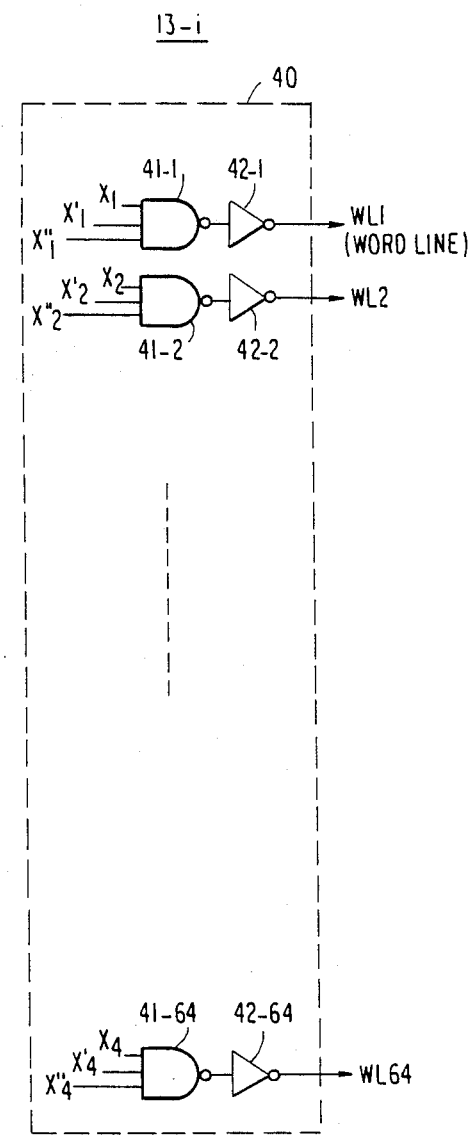
FIG.3A
PRIOR ART
FIG.3B
PRIOR ART

SEMICONDUCTOR MEMORY DEVICE WITH IMPROVED ADDRESS WIRING ARRANGEMENT

BACKGROUND OF THE INVENTION

1. Field of the Invention:

The present invention relates to a semiconductor memory device fabricated on a semiconductor chip.

2. Description of the Related Art:

In a conventional semiconductor memory, a memory cell array is divided to a plurality of sub-arrays so as to increase the memory capacity without causing a decrease of the operation speed and an increase of the power consumption. Especially, in a recently-developed semiconductor memory in which a large memory capacity and a high-speed operation are required, the memory cell array is divided into a plurality of sub-arrays with respect to the directions of word lines or digit lines in some cases. For example, in a 256 K bits dynamic memory, memory cells of 256 K bits are divided into four sub-arrays each having memory cells of 64 K bits and each of the sub-arrays is provided with a row decoder for selecting one of rows of the associated sub-array.

In order to operate the respective row decoders provided for the respective sub-arrays, it is necessary to supply a plurality of address signals to the respective row decoders from an adders buffers. For example, in the case where each of the row decoders receives N-bits of address signals, N-bits of true and complementary address signals are derived from the address buffer and transmitted to the respective row decoders via an address bus composed of 2N address wirings extending along the sub-arrays. The address wirings usually extending in the longitudinal direction of the semiconductor chip and have large lengths. Therefore, the address wirings occupy a relatively large area on the semiconductor chip, and such a large area is a large obstacle to increase the memory capacity and integration density. Moreover, the address wirings themselves have large stray capacitances due to their large lengths. As is well known in the art, all of the address wirings are precharged before an active operation and half of the address wirings are discharged in the active operation. Therefore, a relatively large electric charges are consumed through the precharge and discharge operations of the address wirings.

As explained above, the conventional memory device has large drawbacks that the address wirings occupy a large chip area and consume a large electric current.

SUMMARY OF THE INVENTION

It is an object of the present invention to provide a semiconductor memory device which can be fabricated a on a reduced-size of semiconductor chip with a high-integration structure.

It is another object of the present invention to provide a semiconductor memory device in which a peak current and a power consumption are reduced.

The semiconductor memory device according to the present invention comprises means for receiving a predetermined number of separate address signals, an address buffer circuit responsive to the predetermined number of separate address signals for generating internal address signals of the predetermined number, a plurality of memory cell groups arranged separately, each of the memory cell groups including a plurality of memory cells arranged in a matrix form of rows and columns normal to the rows, a plurality of decoders provided for the memory cell groups, each of the decoders operatively selecting one of the rows of the associated memory cell groups, a plurality of address wirings of the predetermined number connected to the address buffer and connected to the decoders, and a plurality of inverting circuits provided for the decoders, each of the inverting circuits having inputs connected to the address wirings to receive the predetermined number of internal address signals, means for generating complementary internal address signals which are complementary to the internal address signals received, and means for applying the complementary internal address signals to the associated decoder.

According to the present invention, the number of the address wirings can be greatly reduced to a half of those necessitated by the conventional memory device. Therefore, a chip area occupied by the address wirings can be reduced. Moreover, a total capacitance of the address wirings is also reduced and a power consumption caused through precharge and discharge operations of those address wirings is reduced.

BRIEF DESCRIPTION OF THE DRAWINGS

The above and further objects, features and advantages of the present invention will become more apparent from the following detailed description taken in conjunction with the accompanying drawings, wherein:

FIG. 1 is a schematic block diagram showing a memory array arrangement of a semiconductor memory device in the prior art;

FIG. 2 is a schematic block diagram of a unit of an address buffer;

FIG. 3 is a schematic block diagram of a row decoder employed in the memory device of FIG. 1;

DETAILED DESCRIPTION OF THE INVENTION

Figure 4:
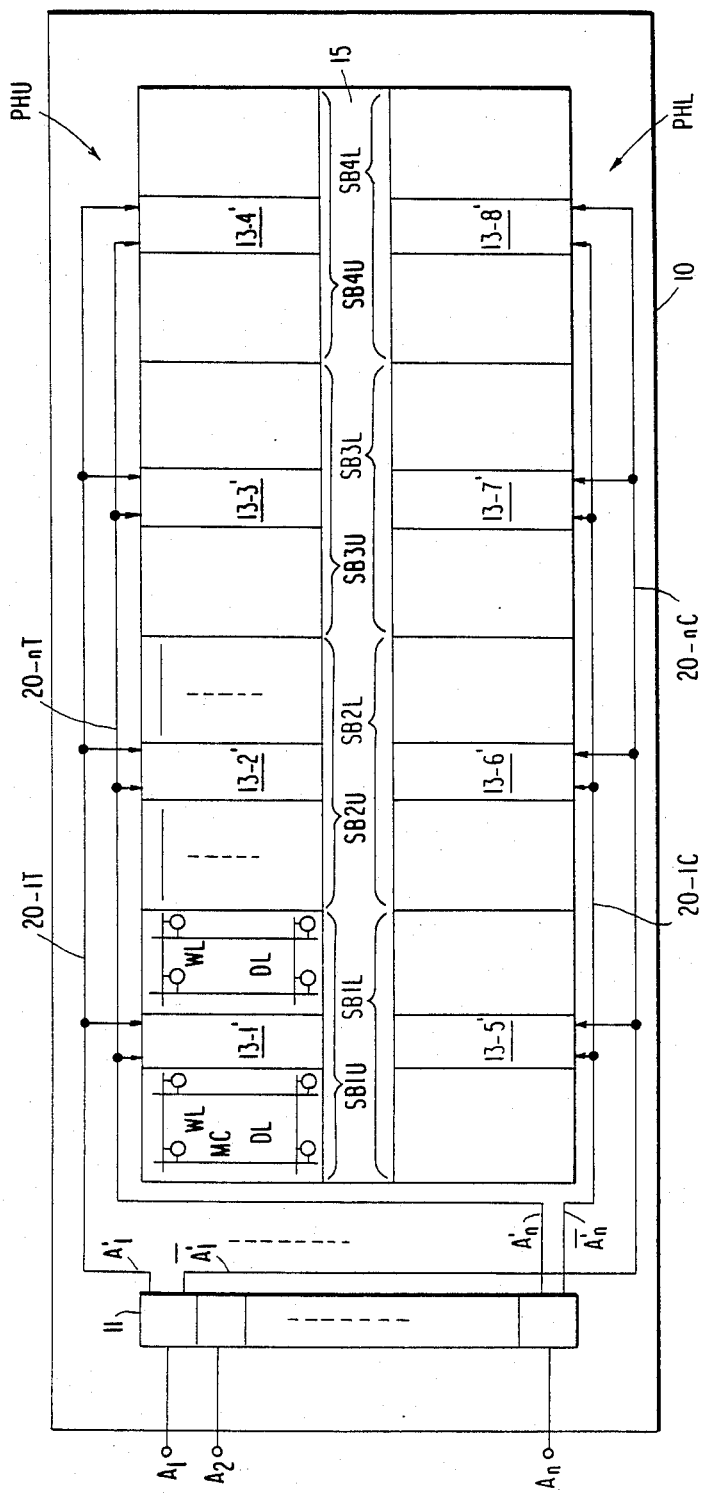
FIG. 4 is a schematic block diagram of a memory device according to one preferred embodiment of the present invention.

Prior Art:

With reference to FIGS. 1 to 3, the conventional semiconductor memory device will be explained.

An example of a chip layout of the conventional semiconductor memory device is illustrated in FIG. 1. As shown in FIG. 1, 8 memory groups SB1U to SB4U and SB1L to SB4L with row decoders 13-1 to 13-8, an address buffer 11 and a data sense and column selection block 15 are formed on a semiconductor chip 10. In the memory group SB1U, two sub-arrays 14-1 and 14-2 each having word lines WL arranged in rows, digit lines arranged in columns and memory cells MC coupled to the word lines WL and the digit lines DL are provided. Also, the row decoder 13-1 is provided between the two sub-arrays 14-1 and 14-2. The row decoder 13-1 operatively selects one of the word lines of the sub-array 14-1 and one of the word lines of the sub-array 14-2 simultaneously. Other memory groups SB2U–SB4U, SB1L–SB4L have the same structure as SB1U. The address buffer 11 includes a plurality of buffer units 11-1 to 11-n coupled to address input terminals A1 to An. Each of the buffer unit 11-i ($1 \leq i \leq n$) receives an address signal from the address input terminal Ai and generates true and complementary internal address signals Ai' and $\overline{Ai}'$ of the received address signal. The plurality of true and complementary internal address signals $A_1', \overline{A_1}' - An', \overline{An}'$ generated by the address buffer 11 are applied to the row decoders 13-1 to 13-8 in common via address wirings 20-1T, 20-1C to 20-nT, 20-nC extending along the longitudinal peripheries of the semiconductor chip 10.

An example of the buffer unit 11-i is shown in FIG. 2. The buffer unit 11-i includes inverters 20-24 connected in a known way.

FIG. 3 shows an example of the row decoders 13-1 to 13-8 for the case of n=6. As shown in FIG. 3, each of the row decoders includes a predecoder section 30 having two-bit decoders 31-1 to 31-3 and an output decoder 31. The two-bit decoder 31-1 includes four NOR gates NO receiving two-bit of address signals $A_1'$, $\overline{A_1}'$ and $A_2'$, $\overline{A_2}'$ and generates four predecode outputs $X_1$ to $X_4$ in response to a low level of a timing signal BE. Similarly, the two-bit decoders 31-2 and 31-3 receives the internal address signals ($A_3'$, $\overline{A_3}'$, $A_4'$, $\overline{A_4}'$) and ($A_5'$, $\overline{A_5}'$, $A_6'$, $\overline{A_6}'$) to generate predecode outputs ($X'_1-X'_4$) and ($X''_1-X''_4$), respectively. A main decoder section 40 includes a plurality of NAND gates 41-1 to 41-64 each receiving one of the outputs of the decoders 31-1, one of the outputs of the decoder 31-2, and one of the decoder 31-3. The outputs of the NAND gates 41-1 to 41-64 are inputted to inverters 42-1 to 42-64 and connected to word lines WL1-WL64, respectively.

In case of this conventional semiconductor memory, the memory cell array is divided with respect to the directions of the word lines, as shown in FIG. 1. Accordingly, the address wirings 20-1T, C to 20-nT, C through which the address buffer output signals Ai', $\overline{Ai}'$ are transmitted necessarily arranged in the peripheral regions on the upper and lower longer sides of the semiconductor chip 10. In general, the wiring material consists of aluminum. For example, in the case where one signal conductor extends in the direction of the longer side of the semiconductor chip, the electrostatic capacitance of the wirings becomes about 4 pF (picofarad). The numbers of the address wirings connected to the row decoders in this conventional example are 2·n in each longer periphery in total. Since these conductors are also arranged on the upper and lower side portions, a grand total of such conductors becomes 4·n.

Thus, a large area is occupied by those address wirings on the semiconductor chip 10 to lower the integration density and the production yields.

Moreover, the respective address wirings have large capacitance such as 4 pF, and thus a grand total of the electrostatic capacity of these conductors becomes as large as $4 \times 4 \cdot n = 16 \cdot n$ pF (picofarad) in the above case of 4 pF. The semiconductor memory constituting this conventional example in which the memory cell array is divided into a plurality of memory groups in the direction of the word lines to achieve a high-speed operation such as 20 ns (nanosecond). If an operating power source voltage of the most common range of 4.5−5.5 V is employed, an average current of the charging and discharge operations in these address wirings can be determined by the following equation.

$$(16 \cdot n \times 10^{-12}) \div 2 \times 5.5 \div (20 \times 10^{-9}) = 8.25 \cdot n \times 10^{-4} (A) \ldots \quad (1)$$

In the equation (1), the electrostatic capacity (16·n pF) is divided by 2 considering that each pair of wirings for Ai' and $\overline{Ai}'$ are not simultaneously charged (or discharged).

It is understood from the above that the semiconductor memory in this conventional example has a large average current e.g. 13.2 mA in case of n=6 owing to the charging and discharging of the address wirings, and this large current cannot be neglected in a semiconductor memory having a maximum average current consumption of, for example, about 100 mA.

Embodiment of the Invention:

The semiconductor memory device according to one preferred embodiment of the present invention will be explained below with reference to FIGS. 4 and 5.

Figure 5A:
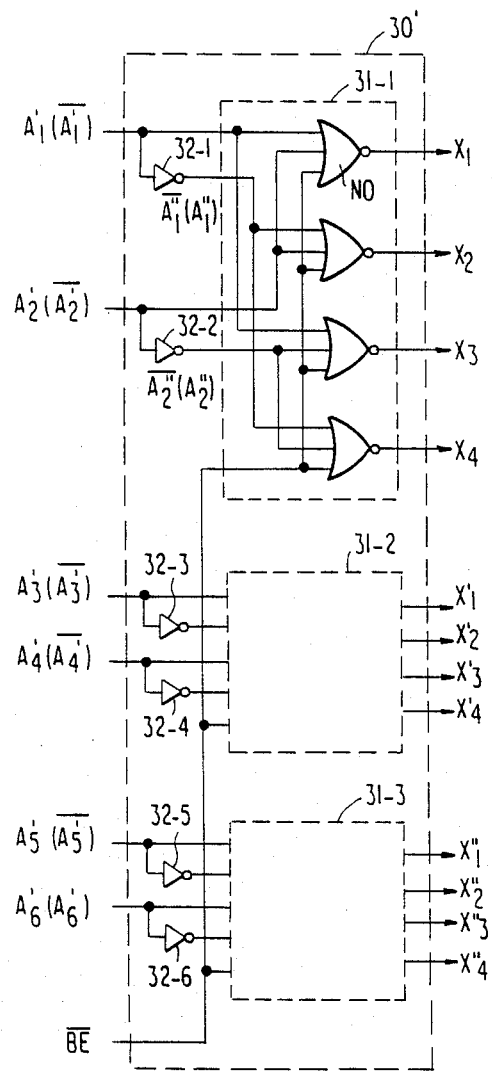
FIG. 5 is a schematic block diagram of an example of the row decoder employed in the memory device of FIG. 4.
Figure 5B:
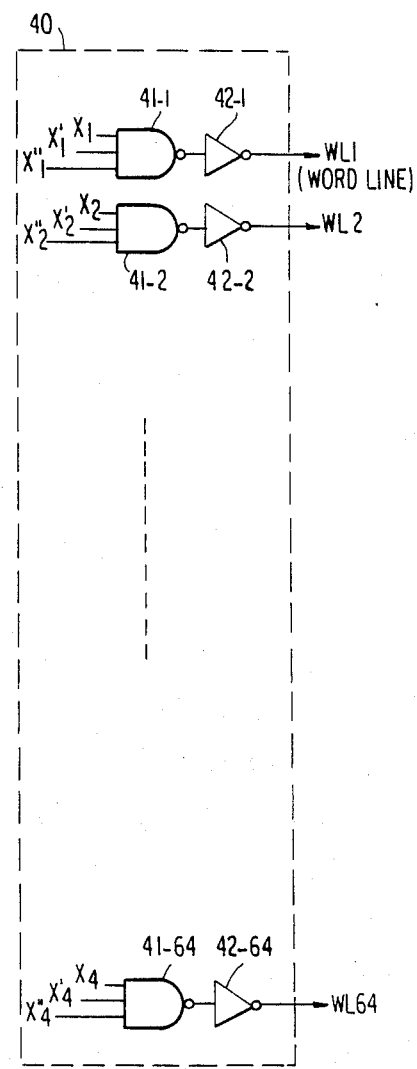

In FIGS. 4 and 5, the elements or portions corresponding to those in FIGS. 1 to 3 are denoted by the same or similar references employed in FIGS. 1 to 3.

As shown in FIG. 4, along the upper periphery PHU of the semiconductor chip 10, n address wirings 20-1T to 20-nT connected to the address buffer 11 to receive the true internal address signals $A_1'$ to $An'$, respectively are arranged in parallel. The n address wirings 20-1T to 20-nT are connected to the row decoders 13-1' to 13-4' of the memory groups SB1U to SB4U on the upper half side of the semiconductor chip 10. Similarly, n-address wirings 20-1C to 20-nC connected to the address buffer 11 to receive the complementary internal address signals $\overline{A_1}'$ to $\overline{An}'$ are arranged along the lower periphery PHL of the semiconductor chip 10. The n address wirings 20-1C to 20-nC are connected to the row decoder 13-5' to 13-8' of the memory groups SB1L to SB4L of the lower half side of the semiconductor chip 10.

As is seen from FIG. 4, only n address wirings are arranged along the respective peripheries of the semiconductor chip 10 in place of 2n address wirings of the conventional memory of FIG. 1. Therefore, area occupied by the address wirings on the semiconductor chip 10 is remarkably reduced. Moreover, the effective length of the respective address wirings is also reduced approximately to the half of the conventional ones, because the each address wirings is arranged only one periphery.

With reference to FIG. 5, one example of the row decoders 13-1' to 13-8' will be explained.

The row decoder includes a predecoder section 30' and the main decoder section 40. In this example, "n" is assumed to be "6" for the sake of simplicity of the explanation, and therefore, the predecoder section 30' receives the internal address signals $A_1$· to $A_6$· or $\overline{A_1}$· to $\overline{An}'$ via the 6 address wirings 20-1T to 20-6T or 20-1C to 20-6C. Since, only one of each pair of true and complementary internal address signals Ai', $\overline{Ai}'$ ($1 \leq i \leq n=6$), inverters 32-1 to 32-6 are provided in the predecoder 30' for generating other internal address signals complementary to the received internal address signals $A'_1 (\overline{A_1}')$ to $A'n (\overline{An}')$. As a result, a plurality of true and complementary internal address signals $A_1'(\overline{A_1}')-A_6'(\overline{A_6}')$ and $\overline{A_1}''(A_1'')-\overline{A_6}''(A_6'')$ are made available in each of the row decoders and applied to the two-bit decoders 31-1 to 31-3 comprising NOR gates NO for producing predecoded signals $X_1-X_4$, $X'_1-X'_4$ and $X''_1-X''_4$ in a known way. The main decoder section 40 is the same as that shown in FIG. 3. In the semiconductor memory device thus constructed according to the present invention, wirings or conductors for $A_1'-A_6'$ are arranged only on the upper longer side portion PHU of the semiconductor chip 10, and wirings for $A_1'-A_6'$ are arranged only on the lower longer side portion PHL thereof. While, each predecoder section 30' has inverters 32-1 to 32-6 therein, which supply signals in the opposite in-phase. It is apparent that a decoding operation is carried out in the same manner as in the above-described conventional example of FIG. 1.

In this embodiment, the number of the address wirings arranged in the peripheral regions on the longer side portions of the semiconductor chip becomes a half of that of such conductors in the above-described conventional example. Accordingly, the total number of these conductors in the example of the present invention becomes twelve in case of n=6. Thus, the area occupied by the address wirings can be greatly reduced. Moreover, due to the reduction in the number of the address wirings, the total electrostatic capacitance associated with the address wirings is also reduced to a half of the conventional case, e.g. 48 pF in case of n=6.

The average currents of the charging and discharge operations in these wirings, which is calculated under the same conditions as in the above-described conventional example, is 6.6 mA as shown in the following equation.

$$(48\times10^{-12})\div 2\times 5.5 \div (20\times 10^{-9})=6.6\times 10^{-3}(A). \quad (2)$$

Therefore, it is understood that the present invention enables the reduction of current consumption of 13.2−6.6=6.6 mA as compared with the conventional example described above.

Figure 6A:
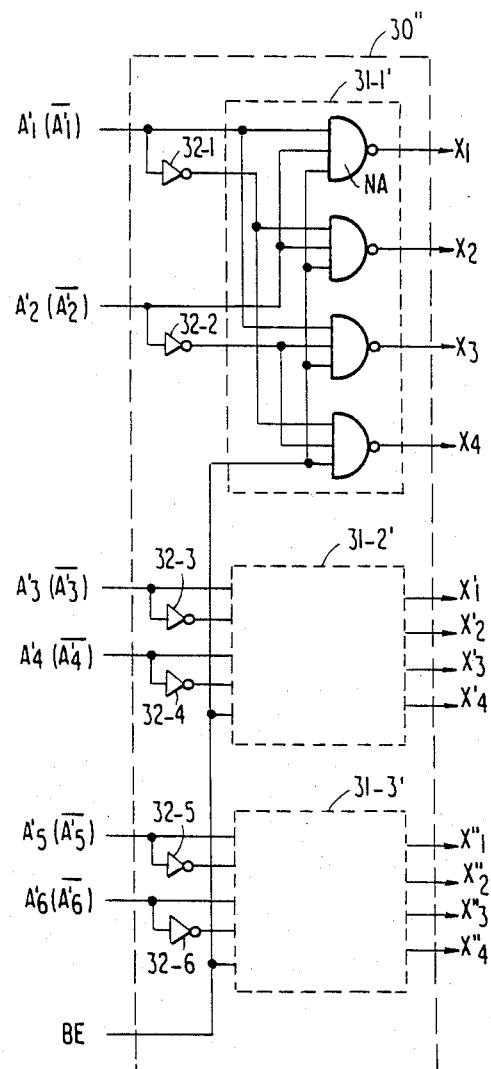
FIG. 6 is a schematic block diagram of another example of the row decoder employed in the memory device of FIG. 4.
Figure 6B:
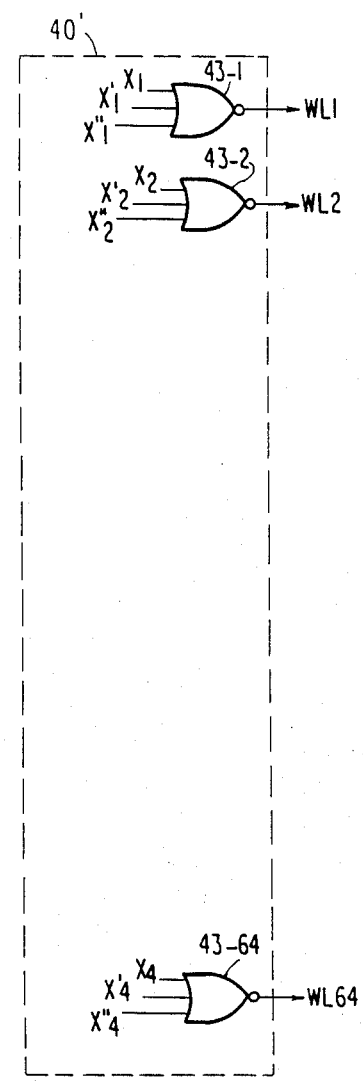

With reference to FIG. 6, another example of the row decoder is shown.

As shown in FIG. 6, each of the two-bit decoders 31-1' to 31-3' comprises NAND gates NA in place of NOR gates NO in the decoder of FIG. 3. Also, in place of the low active timing signal $\overline{BE}$ of FIG. 3, a high active timing signal BE is employed. Also, the main decoder section 40' includes a plurality of NOR gates 43-1 to 43-64 each receiving the respective outputs of the two-bit decoders 31-1' to 31-3' in a known way.

As described above, the semiconductor memory according to the present invention is capable of reducing the charging and discharge currents in the address buffer output signal conductors to a half of those in the conventional example. Consequently, the average current consumption can be reduced to a great extent. The example of the present invention also enables a peak amperage of the charging and discharge current to be reduced by half. Accordingly, the quantity of variation due to the inductance of the electric potential of the power source or GND is reduced, and the operation margin of the semiconductor memory is improved.

In the above embodiments, the arrangement of the internal address signals wirings for the word line selection is described. The present invention can also be applied in the same manner to the arrangement of the internal address wirings for the digit line selection. Needless to say, the present invention can be applied to all types of semiconductor memories. The present invention is not limited to the above-described examples; various applied examples meeting the gist of the present invention can be thought of.

I claim:

1. A semiconductor memory device comprising means for receiving a predetermined number of separate address signals, an address buffer circuit responsive to said predetermined number of separate address signals for generating internal address signals of said predetermined number, a plurality of memory cell groups arranged separately, each of said memory cell groups including a plurality of memory cells arranged in a matrix form of rows and columns normal to said rows, a plurality of decoders provided for said memory cell groups, respectively, each of said decoders operatively selecting one of the rows of the associated memory cell group, a plurality of address wirings of said predetermined numbers connected to said address buffer and connected to said predetermined number of said decoders, each of said decoders incorporating all of the internal address signals of said predetermined number only through said address wirings, each of said decoders including a plurality of inverting circuits of said predetermined number, each of said inverting circuits receiving one of said predetermined number of internal address signals thereby to generate the complement of the received internal address signal, and decode means receiving said predetermined number of said internal address signals and the complement thereof generated by the inverting circuits of said predetermined number included therein thereby to select one of the rows of the associated memory cell group.

2. The semiconductor memory device according to claim 1, in which said decode means includes a predecoder section having a plurality of 2-bit decoders and a main decoder section having a plurality of logic gates, each of said logic gates receiving the respective one outputs of said 2-bit decoders.

3. The semiconductor memory device according to claim 1, in which said memory cell groups are arranged in a longitudinal direction of a semiconductor chip and said address wirings extending in said longitudinal direction along said memory cell groups.

4. A semiconductor memory device comprising a semiconductor chip having first parallel peripheries and second parallel peripheries shorter than said first parallel peripheries, an address buffer circuit arranged near one of said second parallel peripheries, said address buffer circuit being responsive to a predetermined number of address signals for generating internal address signals of said predetermined number, a plurality of decoders arranged separately in the direction of said first parallel peripheries, a plurality of wirings of said predetermined number coupled to said address buffer circuit and said decoders, each of said decoders incorporating all of the internal address signals of said predetermined number only through said address wirings, each of said decoders including a plurality of inverting circuits of said predetermined number, each of said inverting circuit receiving one of said predetermined number of internal address signals thereby to generate the complement the received internal address signal and decode means receiving said predetermined number of internal signals and the complement thereof generated by the inverting circuits of said predetermined number included in the same decoder to perform a decoding operation.

5. The semiconductor memory device according to claim 4, in which said decoder means includes a predecoder section having a plurality of 2-bit decoders receiving the internal address signals and the complement thereof, and a main decoder section having a plurality of logic gates receiving output signals of said 2-bit decoders.

6. The semiconductor memory device according to claim 4, further comprising a plurality of memory cell groups arranged separately in the direction of said first parallel peripheries.

* * * * *

UNITED STATES PATENT AND TRADEMARK OFFICE
CERTIFICATE OF CORRECTION

PATENT NO. : 4,953,134

DATED : August 28, 1990

INVENTOR(S) : Yasuo KOBAYASHI

It is certified that error appears in the above-identified patent and that said Letters Patent is hereby corrected as shown below:

Col. 1, line 55, delete first occurrence of "a".

Col. 3, line 22, delete "BE" and insert --$\overline{BE}$--;

Col. 3, line 37, delete "$\widehat{Ai'}$" and insert --$\overline{Ai'}$--;

Col. 3, lines 67 and 68, delete "$10^{31}$ a)" and insert --$10^{-9}$ )--.

Col. 4, line 61, delete "$A_6$" " and insert --$\overline{A_6''}$--.

Signed and Sealed this

Thirty-first Day of December, 1991

*Attest:*

HARRY F. MANBECK, JR.

*Attesting Officer*  *Commissioner of Patents and Trademarks*